(12) United States Patent
Kopp et al.

(10) Patent No.: US 12,051,768 B2
(45) Date of Patent: Jul. 30, 2024

(54) OPTOELECTRONIC SEMICONDUCTOR COMPONENT WITH A CURRENT SPREADING STRUCTURE CONTAINING SILVER, AND OPTOELECTRONIC DEVICE

(71) Applicant: Osram OLED GmbH, Regensburg (DE)

(72) Inventors: Fabian Kopp, Tanjung Tokong Penang (MY); Attila Molnar, Penang (MY); Franz Eberhard, Kilchberg (CH)

(73) Assignee: OSRAM OLED GmbH, Regensburg (DE)

( * ) Notice: Subject to any disclaimer, the term of this patent is extended or adjusted under 35 U.S.C. 154(b) by 721 days.

(21) Appl. No.: 17/258,757

(22) PCT Filed: Jul. 11, 2019

(86) PCT No.: PCT/EP2019/068704
§ 371 (c)(1),
(2) Date: Jan. 8, 2021

(87) PCT Pub. No.: WO2020/011931
PCT Pub. Date: Jan. 16, 2020

(65) Prior Publication Data
US 2021/0328106 A1    Oct. 21, 2021

(30) Foreign Application Priority Data
Jul. 13, 2018 (DE) .................... 10 2018 117 018.1

(51) Int. Cl.
*H01L 33/40* (2010.01)
*H01L 33/42* (2010.01)
(Continued)

(52) U.S. Cl.
CPC ............ *H01L 33/405* (2013.01); *H01L 33/42* (2013.01); *H01L 33/46* (2013.01); *H01L 33/62* (2013.01);
(Continued)

(58) Field of Classification Search
CPC ....... H01L 33/42; H01L 33/405; H01L 33/46; H01L 33/62; H01L 25/16; H01L 25/0655;
(Continued)

(56) References Cited

U.S. PATENT DOCUMENTS

2005/0139825 A1    6/2005  Song et al.
2011/0024784 A1*   2/2011  Song .................. H01L 33/58
                                                  257/98
(Continued)

FOREIGN PATENT DOCUMENTS

DE    102010025320 A1    12/2011
DE    102010035966 A1    3/2012
(Continued)

OTHER PUBLICATIONS

Search Report issued for the corresponding German Patent Application No. 10 2018 117 018.1 dated Feb. 14, 2019, 10 pages (for reference purposes only).
(Continued)

*Primary Examiner* — Victor A Mandala
*Assistant Examiner* — Lawrence C Tynes, Jr.
(74) *Attorney, Agent, or Firm* — Viering, Jentschura & Partner mbB; Robert M Bilotta, Jr.

(57) ABSTRACT

An optoelectronic semiconductor component comprises a first semiconductor layer of a first conductivity type having a first main surface and a second semiconductor layer of a second conductivity type arranged on a side facing away from the first main surface of the first semiconductor layer. The optoelectronic semiconductor component further com-
(Continued)

prises, on the side of the first main surface, a first current spreading structure electrically connected to the first semiconductor layer and a second current spreading structure electrically connected to the second semiconductor layer. The optoelectronic semiconductor component furthermore includes a dielectric mirror layer arranged on the side of the first main surface of the first semiconductor layer and on a side of the first or second current spreading structure facing away from the first semiconductor layer. At least one of the first and second current spreading structures contains silver.

17 Claims, 11 Drawing Sheets

(51) Int. Cl.
HO1L 33/46 (2010.01)
HO1L 33/62 (2010.01)
(52) U.S. Cl.
CPC .............. H01L 2933/0016 (2013.01); H01L 2933/0025 (2013.01)
(58) Field of Classification Search
CPC . H01L 25/072; H01L 25/0753; H01L 25/115; H01L 25/042; H01L 2924/19041; H01L 2924/19105; H01L 2924/3511; H01L 2924/1205; H01L 28/40–42; H01L 27/0629–0635; H01L 27/0288; H01L 27/0647–0658; H01L 27/067–0682; H01L 27/0248–0296; H01L 2224/02372; H01L 2224/023–024; H01L 23/552–556; H01L 23/36–3738; H01L 23/367–3677; H01L 2933/0016; H01L 2933/0025
See application file for complete search history.

(56) References Cited

U.S. PATENT DOCUMENTS

| 2012/0074441 A1* | 3/2012 | Seo ................. H01L 33/10 257/E33.068 |
| 2012/0161176 A1 | 6/2012 | Heo et al. |
| 2013/0187192 A1 | 7/2013 | Hoeppel |
| 2013/0193464 A1* | 8/2013 | Bae ................. H01L 33/405 257/94 |
| 2013/0341634 A1 | 12/2013 | Heikman et al. |
| 2015/0207051 A1* | 7/2015 | Yoon ................. H01L 33/14 362/382 |
| 2015/0270442 A1 | 9/2015 | Chae et al. |
| 2016/0064611 A1 | 3/2016 | Choi et al. |
| 2016/0211420 A1 | 7/2016 | Donofrio et al. |
| 2016/0218097 A1 | 7/2016 | Ploessl et al. |
| 2017/0125641 A1 | 5/2017 | Jeon et al. |
| 2018/0351046 A1 | 12/2018 | Baur et al. |
| 2019/0140143 A1 | 5/2019 | Pfeuffer |
| 2019/0371969 A1 | 12/2019 | Kopp et al. |

FOREIGN PATENT DOCUMENTS

| DE | 102013110853 A1 | 4/2015 |
| DE | 112013005849 T5 | 8/2015 |
| DE | 102015114446 A1 | 3/2016 |
| DE | 202011110910 U1 | 3/2017 |
| DE | 102015120323 A1 | 5/2017 |
| DE | 102016111113 A1 | 12/2017 |
| DE | 102016124847 A1 | 6/2018 |
| WO | 2017133770 A1 | 8/2017 |
| WO | 2019020424 A1 | 1/2019 |

OTHER PUBLICATIONS

International Search Report issued for the corresponding International Application No. PCT/EP2019/068704 mailed on Oct. 15, 2019, 4 pages (for reference purposes only).

* cited by examiner

OPTOELECTRONIC SEMICONDUCTOR COMPONENT WITH A CURRENT SPREADING STRUCTURE CONTAINING SILVER, AND OPTOELECTRONIC DEVICE

CROSS-REFERENCE TO RELATED APPLICATIONS

The present application is a national stage entry according to 35 U.S.C. § 371 of PCT application No.: PCT/EP2019/068704 filed on Jul. 11, 2019; which claims priority to German Patent Application Serial No.: 10 2018 117 018.1 filed on Jul. 13, 2018; all of which are incorporated herein by reference in their entirety and for all purposes.

TECHNICAL FIELD

The present disclosure pertains to semiconductor devices and methods of producing such devices having one or more dielectric mirror layers and a current spreading layer having silver.

BACKGROUND

A light emitting diode (LED) is a light emitting device based on semiconductor materials. For example, an LED includes a p-n junction. When electrons and holes recombine with one another in the region of the p-n junction, for example due to a corresponding voltage being applied, electromagnetic radiation is generated.

In general, new concepts are being sought which allow improved electrical contacting of the semiconductor layers to be achieved while miniaturization of optoelectronic semiconductors is progressing. At the same time, the output efficiency of the optoelectronic semiconductor component is to be improved.

It is an object to provide an improved optoelectronic semiconductor component, an improved method for producing an optoelectronic semiconductor component and an improved optoelectronic device.

SUMMARY

According to embodiments, an optoelectronic semiconductor component comprises a first semiconductor layer of a first conductivity type having a first main surface, and a second semiconductor layer of a second conductivity type which is arranged on a side facing away from the first main surface of the first semiconductor layer. The optoelectronic semiconductor component also comprises a first current spreading structure on the side of the first main surface which is connected to the first semiconductor layer in an electrically conductive manner, and a second current spreading structure which is connected to the second semiconductor layer in an electrically conductive manner. The optoelectronic semiconductor component furthermore includes a dielectric mirror layer which is arranged on the side of the first main surface of the first semiconductor layer and on a side of the first or second current spreading structure facing away from the first semiconductor layer. At least one of the first and second current spreading structures contains silver.

For example, the dielectric mirror layer is directly adjacent to side walls of the first and/or the second current spreading structure.

According to embodiments, the first current spreading structure comprises a first contact layer and a first current spreading layer made of silver and directly adjacent to the first contact layer. For example, the first current spreading structure may furthermore comprise a first barrier layer, a combination of the first contact layer and the first barrier layer completely enclosing the first current spreading layer made of silver.

Furthermore, the second current spreading structure may comprise a second contact layer and a second current spreading layer made of silver and directly adjacent to the second contact layer. For example, the second current spreading structure may furthermore comprise a second barrier layer, a combination of the second contact layer and the second barrier layer completely enclosing the second current spreading layer made of silver.

The optoelectronic semiconductor component may furthermore comprise a first and a second bond pad, wherein the first bond pad is connected to the first current spreading structure via a first connecting element and the second bond pad is connected to the second current spreading structure via a second connection element, the first and second bond pads each being arranged on a side of the dielectric mirror layer facing away from the first and second semiconductor layer, and the first and second connecting elements each extending through the dielectric mirror layer.

Moreover, the optoelectronic semiconductor component may include a transparent conductive layer between the first contact layer of the first current spreading structure and the first semiconductor layer. According to embodiments, a dielectric mirror element may be arranged between the transparent conductive layer and the first semiconductor layer. Furthermore, a dielectric mirror element may be arranged between the second semiconductor layer and the second current spreading structure.

For example, the first and second semiconductor layers may be arranged over a transparent substrate having a first main surface, on a side facing away from the first main surface of the substrate. The optoelectronic semiconductor component may, for example, emit generated electromagnetic radiation via the first main surface of the substrate.

According to embodiments, the second current spreading structure may be directly adjacent to a part of the first semiconductor layer, a part of the first semiconductor layer being insulated from the first current spreading structure.

The optoelectronic semiconductor component may furthermore comprise a metal structure which is arranged in the dielectric mirror layer or directly adjacent to a side of the dielectric mirror layer facing away from the first semiconductor layer.

A method for producing an optoelectronic semiconductor component comprises forming a layer stack comprising a first semiconductor layer of a first conductivity type and a second semiconductor layer of a second conductivity type over a transparent substrate, wherein the second semiconductor layer is arranged between the first semiconductor layer and the substrate, and a first main surface of the first semiconductor layer is located on a side of the first semiconductor layer facing away from the second semiconductor layer. The method further comprises forming a first current spreading structure which is connected to the first semiconductor layer, and a second current spreading structure which is connected to the second semiconductor layer, each on the side of the first main surface, wherein at least one of the first and second current spreading structures contains silver. Moreover, the method includes forming a dielectric mirror layer on the side of the first main surface of the first semiconductor layer and on a side of the first or second current spreading structure facing away from the first semiconductor layer.

An optoelectronic device includes a transparent substrate, a first semiconductor layer of a first conductivity type and a second semiconductor layer of a second conductivity type, which is arranged between the transparent substrate and the first semiconductor layer. The first and second semiconductor layers are patterned to form at least a first and a second light-emitting region. The optoelectronic device furthermore includes a connecting structure which is suitable for connecting the second semiconductor layer of the first light-emitting region to the first semiconductor layer of the second light-emitting region and which contains silver. Moreover, the optoelectronic device has a dielectric mirror layer which is arranged on a side of the second semiconductor layer facing away from the substrate, on a side of the first semiconductor layer facing away from the substrate and on a side of the connecting structure facing away from the first semiconductor layer.

For example, the dielectric mirror layer is directly adjacent to side walls of the connecting structure. The connecting structure may comprise a contact layer and a first connecting layer made of silver and directly adjacent to the contact layer. The connecting structure may, furthermore, comprise a barrier layer, a combination of the contact layer and the barrier layer completely enclosing the contact layer made of silver.

The optoelectronic device may, moreover, comprise a transparent conductive layer between the contact layer and the first semiconductor layer.

An optoelectronic element has the optoelectronic semiconductor component or the optoelectronic device described above. For example, the optoelectronic element is an LED filament.

BRIEF DESCRIPTION OF THE DRAWINGS

The accompanying drawings serve to provide an understanding of non-limiting embodiments. The drawings illustrate non-limiting embodiments and, together with the description, serve to explain them. Further non-limiting embodiments and many of the intended advantages will become apparent directly from the following detailed description. The elements and structures shown in the drawings are not necessarily shown to scale relative to each other. Like reference numerals refer to like or corresponding elements and structures.

DETAILED DESCRIPTION

Figure 1A:
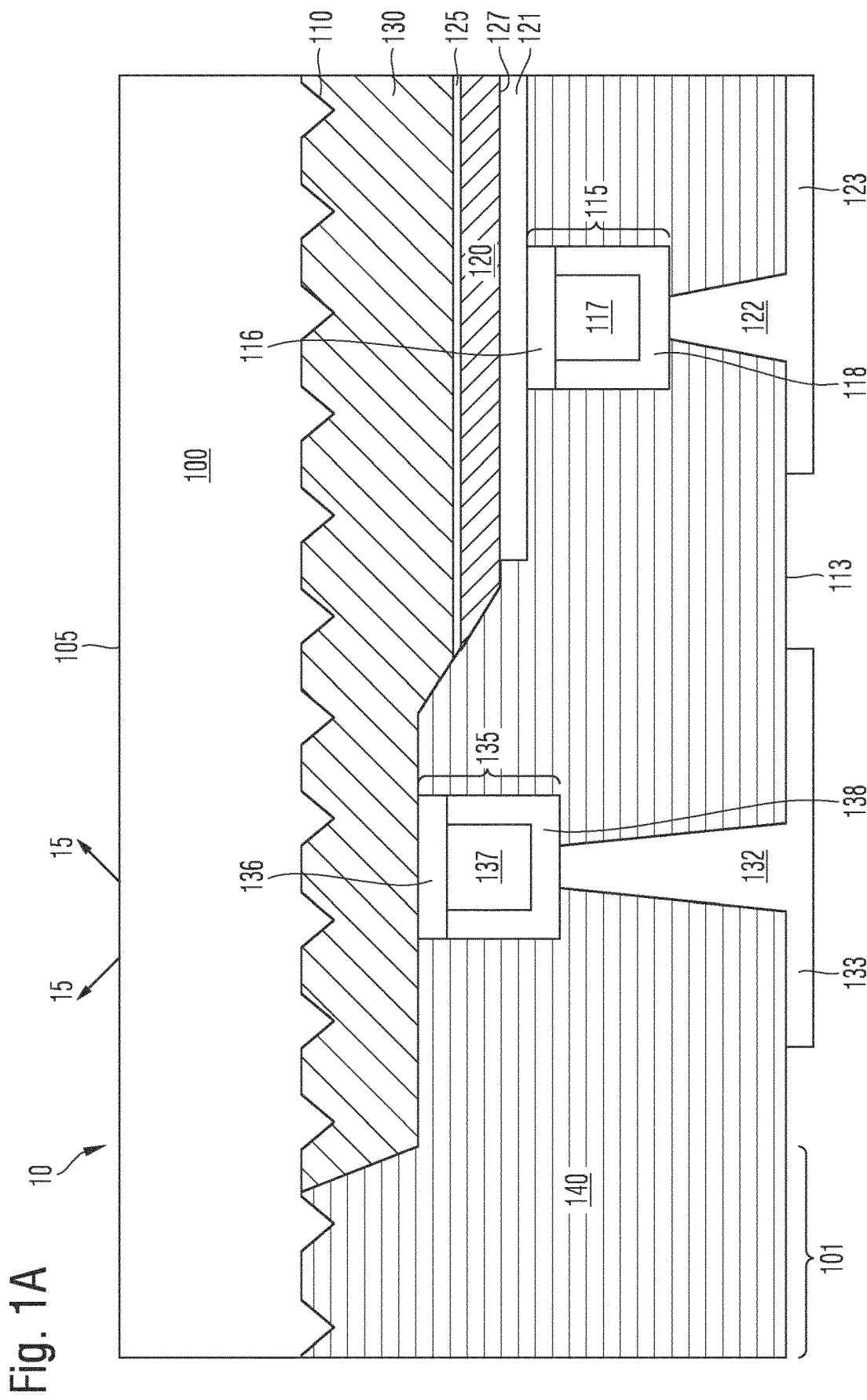
FIG. 1A shows a schematic cross-sectional view of part of an optoelectronic semiconductor component according to embodiments.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is only used by way of explanation and is in no way intended to be limiting.

The description of the exemplary embodiments is not limiting, since there are also other exemplary embodiments and structural or logical changes may be made without departing from the scope as defined by the patent claims. In particular, elements of the exemplary embodiments described below may be combined with elements from others of the exemplary embodiments described, unless the context indicates otherwise.

The terms "wafer" or "semiconductor substrate" used in the following description may include any semiconductor-based structure that has a semiconductor surface. Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material or of an insulating material, for example sapphire. Depending on the intended use, the semiconductor may be based on a direct or an indirect semiconductor material. Examples of semiconductor materials particularly suitable for generating electromagnetic radiation include, without limitation, nitride semiconductor compounds, by means of which, for example, ultraviolet, blue or long-wave light may be generated, such as GaN, InGaN, AlN, AlGaN, AlGaInN, phosphide semiconductor compounds by means of which, for example, green or longer-wave light may be generated, such as GaAsP, AlGaInP, GaP, AlGaP, and other semiconductor materials such as AlGaAs, SiC, ZnSe, GaAs, ZnO, Ga2O3, diamond, hexagonal BN and combinations of the materials mentioned. The stoichiometric ratio of the ternary compounds may vary. Other examples of semiconductor materials may include silicon, silicon germanium, and germanium. In the context of the present description, the term "semiconductor" also includes organic semiconductor materials.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The term "vertical" as used in this description is intended to describe an orientation which is essentially perpendicular to the first surface of the semiconductor substrate or semiconductor body.

To the extent used herein, the terms "have", "contain", "comprise", and the like are open-ended terms that indicate the presence of said elements or features, but do not exclude the presence of further elements or features. The indefinite articles and the definite articles include both the plural and the singular, unless the context clearly indicates otherwise.

In the context of this description, the term "electrically connected" means a low-ohmic electrical connection between the connected elements. The electrically connected elements do not necessarily have to be directly connected to one another. Further elements may be arranged between electrically connected elements. The term "electrically connected" also encompasses tunnel contacts between the connected elements.

In general, the term "dielectric mirror layer" encompasses any arrangement that reflects incident electromagnetic radiation to a large degree (>70%) and is non-conductive. For example, a dielectric mirror layer may be formed by a sequence of very thin dielectric layers each having different refractive indices. For example, the layers may alternately have a high refractive index (n>1.7) and a low refractive index (n<1.7) and may be formed as a Bragg reflector. For example, the layer thickness may be λ/4, wherein A indicates the wavelength of the light to be reflected. The layer, as viewed from the incident light, may have a greater layer thickness, for example 3λ/4. Due to the small layer thickness and the difference in the respective refractive indices, the dielectric mirror layer provides high reflectivity and is at the same time non-conductive. The reflection behavior may be angle-dependent. A dielectric mirror layer may, for example, comprise 2 to 50 dielectric layers. A typical layer thickness of the individual layers may be about 30 to 90 nm, for example about 50 nm. The layer stack may furthermore contain one or two or more layers that are thicker than about 180 nm, for example thicker than 200 nm. The layers of the dielectrical mirror layer may contain, for example, $SiO_2$, $TiO_2$, $Nb_2O_5$, $Al_2O_3$, SiNX or $MgF_2$.

FIG. 1A shows a schematic cross-sectional view of an optoelectronic semiconductor component 10 according to embodiments. The optoelectronic semiconductor component 10 comprises a first semiconductor layer 120 of a first conductivity type, for example p-type, having a first main surface 127. The optoelectronic semiconductor component furthermore comprises a second semiconductor layer 130 of a second conductivity type, which is arranged on a side facing away from the first main surface 127 of the first semiconductor layer 120. The optoelectronic semiconductor component furthermore comprises a first current spreading structure or current distribution structure 115, which is connected to the first semiconductor layer 120 in an electrically conductive manner. The first current spreading structure 115 is arranged on the side of the first main surface 127. Furthermore, the optoelectronic semiconductor component comprises a second current spreading structure 135, which is connected to the second semiconductor layer 130 in an electrically conductive manner. The second current spreading structure 135 is also arranged on the side of the first main surface 127. At least one of the first and second current spreading structures 115, 135 contains silver. The optoelectronic semiconductor component 10 furthermore comprises a dielectric mirror layer 140. The dielectric mirror layer 140 is arranged on the side of the first main surface 127 of the first semiconductor layer 120 and on a side of the first or second current spreading structure facing away from the first semiconductor layer.

For example, the dielectric mirror layer 140 may be arranged such that it almost completely surrounds the first and/or the second current spreading structure 115, 135 on three sides. For example, the dielectric mirror layer 140 may be directly adjacent to side walls of the first and/or the second current spreading structure 115, 135. For example, the dielectric mirror layer may be formed with a layer thickness such that it extends from a side facing the first semiconductor layer 120 to a side of the first or second current spreading structure 115, 135, which contains silver, facing away from the first semiconductor layer. For example, a layer thickness of the dielectric mirror layer 140 may be greater than a layer thickness of the first and/or second current spreading structure, which contains silver. According to embodiments, the layer thickness of the dielectric mirror layer may be significantly greater than, for example, at least twice as great as the layer thickness of the first and/or second current spreading structure, which contains silver. The layer thickness is in each case measured in a growth direction, for example perpendicular to the first main surface of the first semiconductor layer 120. The electrical mirror layer 140 may for example have a layer thickness of more than 500 nm, for example more than 1000 nm or more than 1500 nm. The layer thickness may be less than 6000 nm, for example less than 5000 nm or less than 4500 nm.

The first current spreading structure 115 may comprise, for example, a first contact layer 116 and a first current spreading layer 117 made of silver and directly adjacent to the first contact layer 116. The second current spreading structure 135 may likewise comprise a second contact layer 136 and a second current spreading layer 137 made of silver and directly adjacent to the second contact layer 136. For example, the first and/or the second contact layer may contain a transparent conductive oxide, for example zinc oxide or ITO ("indium tin oxide"). A thickness of the contact layer may for example be more than 5 and less than 100 nm, for example 10 to 60 nm or 10 to 40 nm. For example, due to its high Schottky barrier, silver may have a high contact resistance to the second semiconductor layer. The presence of the contact layer 136 lowers the Schottky barrier.

The first or second current spreading layer 117, 137 may consist of or contain silver. For example, the first or second current spreading layer 117, 137 may include a layer stack, one or more layers of which each contain or consist of silver. Furthermore, the first current spreading structure 115 may further comprise a first barrier layer 118. A combination of the first contact layer 116 and the first barrier layer 118 may completely enclose the first current spreading layer 117. In a similar manner, the second current spreading structure may further include a second barrier layer 138, a combination of the second contact layer and the second barrier layer 138 completely enclosing the second current spreading layer made of silver.

The first and/or second current spreading structure 115, 135 or current spreading layer 117, 137 may have a smaller lateral extent than the first semiconductor layer or an exposed part of the second semiconductor layer.

A material of the barrier layer may include, for example, a transparent conductive oxide, for example ZnO, ITO, or a metal such as Ti, Pt, Rh, Ru, Ni, Cr, W, or a layer stack made of these materials. The layer thickness of the barrier layer may be more than 10 nm and less than 700 nm. For example, a layer thickness of the barrier layer may be in a range from 30 to 500 nm or 100 to 300 nm.

The phrase "a combination of the first contact layer and the barrier layer completely encloses the current spreading layer made of silver" means that, for example, in the cross section shown in FIG. 1, in a direction perpendicular to an extension direction of the first and second current spreading structure 115, 135, each interface of the current spreading layer made of silver is covered with at least one of the contact layer and the barrier layer. As a result, extensive encapsulation of the silver layer 117, 137 is achieved. Furthermore, the dielectric mirror layer 140 is arranged, for example, in such a way that it completely surrounds each of the the first or second current spreading structure 115, 135—except where the first connecting element 122 or the second connecting element 132 is directly adjacent to the first or second current spreading structure 115, 135, respectively. As a result, migration of silver ions, which may be caused by moisture, for example, may be largely suppressed. By using the dielectric mirror layer 140 to encapsulate the current spreading structures 115, 135, the dielectric mirror layer 140 fulfills a dual function in the optoelectronic semiconductor component.

Silver has very good reflectivity for electromagnetic radiation emitted by the optoelectronic semiconductor component. In particular, when GaN-containing materials are used as first and second semiconductor layers 120, 130, the optoelectronic semiconductor component 10 emits blue or green light, which is reflected particularly well by the current spreading layer made of silver. In addition, silver has a high transverse conductivity, so that the first and/or second semiconductor layer 120, 130 may be contacted with low contact resistance.

As described, by using a current spreading layer containing silver, it is possible to both increase the reflectivity of the emitted electromagnetic radiation and improve the contacting of the optoelectronic semiconductor component. At the same time, the special encapsulation structure, which is ensured in particular by the presence of the dielectric mirror 140, prevents problems which could arise when using a silver-containing structure within the semiconductor component.

According to embodiments, both the first and the second current spreading structure may contain silver. However, it is also possible for only the first or only the second current spreading structure to contain silver. In this case, it is sufficient if only that current spreading structure which contains silver is encapsulated by the dielectric mirror 140. In this case, for example, the current spreading structure which does not contain any silver may only be partially surrounded by the dielectric mirror. Furthermore, in this case, it is sufficient if only that current spreading layer 117, 137 which contains silver is completely enclosed by the combination of the contact layer 116, 136 and the barrier layer 118, 138.

The layer stack comprising first semiconductor layer 120 and second semiconductor layer 130 may be formed over a transparent substrate 100, for example a sapphire substrate. A first main surface 105 of the substrate 100 faces away from the semiconductor layer stack. The second main surface 110 of the substrate 100 may be patterned or roughened in order to increase the output efficiency of the electromagnetic radiation generated. An active region 125 may be arranged between first and second semiconductor layers 120, 130. The active region 125 may, for example, comprise a p-n junction, a double heterostructure, a single quantum well structure (SQW, single quantum well) or a multi-uantum well structure (MQW, multi quantum well) for generating radiation. The term "quantum well structure" does not imply any particular meaning here with regard to the dimensionality of the quantization. Therefore it includes, among other things, quantum wells, quantum wires, and quantum dots as well as any combination of these layers.

Electromagnetic radiation 15 emitted by semiconductor component 10 is output, for example, via the first main surface 105 of the transparent substrate 100. Another part of the emitted electromagnetic radiation may be output via side surfaces. The optoelectronic semiconductor component 10 thus represents a flip-chip component in which contacts for contacting the semiconductor layers are arranged on a side of the semiconductor layer stack that faces away from the emission surface of the semiconductor component. A part of the emitted electromagnetic radiation will also be emitted laterally, since such types of LEDs are volume emitters.

For example, a part of the second semiconductor layer 130 may be etched away laterally in an edge region 101. The dielectric mirror layer 140 may be arranged in this edge region 101 in such a way that it covers the interface between the insulating substrate 100 and the second semiconductor layer 130. For example, by such an arrangement of the electrical mirror layer 140, short circuits, for example between the first bond pad 123 and the second semiconductor layer 130, may be avoided. Furthermore, a part of the first semiconductor layer 120 may be removed, so that, on the one hand, it is possible to contact the second semiconductor layer 130. Furthermore, the junction between the first semiconductor layer 120, the active region 125 and the second semiconductor layer 130 may be covered by the dielectric mirror layer 140. In this manner, short circuits between the first and second semiconductor layers 120, 130 may be avoided. For example, the dielectric mirror layer 140, as shown in FIG. 1A, may extend along the lateral side of both the first semiconductor layer 120 and the second semiconductor layer 130. Furthermore, the dielectric mirror layer 140 may be arranged over the exposed surface area of the second semiconductor layer 130 and over the first main surface 127 of the first semiconductor layer 120. The dielectric mirror layer 140 may thus completely enclose the semiconductor material of the first and second semiconductor layers 120, 130 and of the active region 125.

According to further embodiments, the edge region 101 may not be covered locally by the dielectric mirror layer 140.

For example, a first bond pad 123 may be connected to the first current spreading structure 115 via a first connecting element 122. A second bond pad 133 may be connected to the second current spreading structure 135 via a second connecting element 132. For example, the first bond pad 123 and the second bond pad 133 may each be arranged on a first main surface 113 of the dielectric mirror layer 140 facing away from the first and second semiconductor layers 120, 130. The first or the second bond pad may, for example, be formed from a layer stack. The layer stack may, for example, comprise an adhesive layer (not shown). The adhesive layer may be formed from Ti, Cr, Al, Mo, Ni, or W, for example. The bond pad may furthermore include a reflective layer which may be made of Ag, Al, or Rh. The bond pad may furthermore contain a barrier layer, for example made of Ti, Pt, Ni, Cr, Rh, or Ru, and an encapsulation layer, for example made of gold. The first and the second connecting elements 122, 132 may each extend through the dielectric mirror layer 140.

According to embodiments, a transparent contact layer 121 may additionally be arranged between the first semiconductor layer 120 and the first contact layer 116 or the first current spreading structure 115. As a result, on the one hand, the Schottky barrier to the first semiconductor layer 120 is reduced and thus the contact resistance is lowered. The transparent contact layer 121 may, for example, have a larger lateral or horizontal extent than the first current spreading structure 115. Furthermore, the area of contact to the first semiconductor layer 120 is enlarged, as a result of which a more homogeneous current injection is achieved. In addition, owing to the transparent contact layer 121 being transparent, the emitted radiation will not be absorbed and the efficiency of the component will not be significantly impaired by the presence of the transparent contact layer 121. The transparent contact layer 121 may be constructed from ITO, for example. A layer thickness of the transparent contact layer 121 may be greater than 15 nm, for example. For example, it may be greater than 20 nm. The layer thickness may be less than 200 nm. For example, it may be less than 80 nm or less than 40 nm.

Figure 1B:
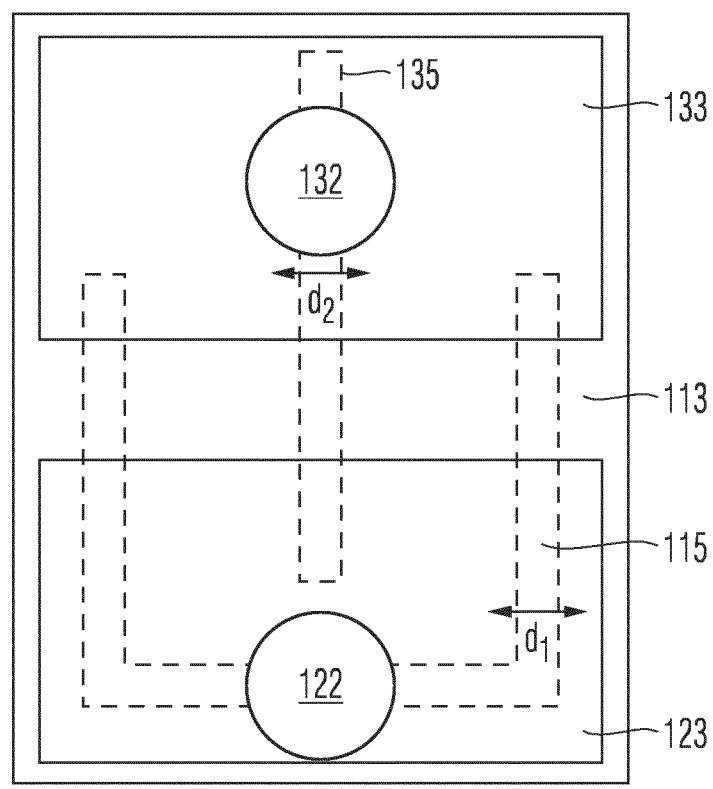
FIG. 1B shows a schematic plan view of the rear side of an optoelectronic semiconductor component according to embodiments.
Figure 2A:
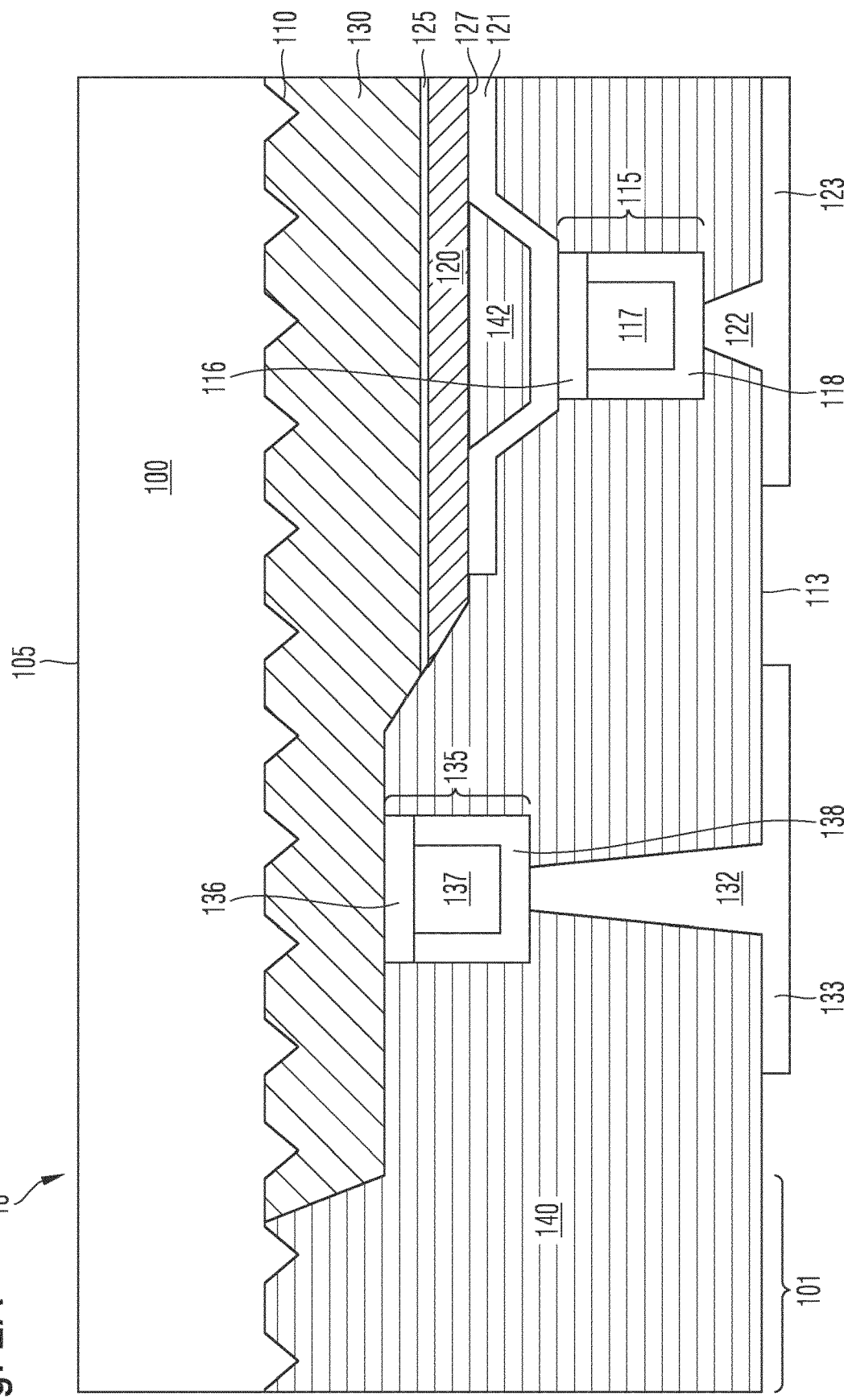
FIGS. 2A to 2D show schematic cross-sectional views of optoelectronic semiconductor components according to further embodiments.

FIG. 1B shows a top view of the first main surface 113 of the dielectric mirror layer 140. As shown in FIG. 1B, the first and second bond pads 123, 133 are arranged on the first main surface 113 of the dielectric mirror layer. The first bond pad 123 is connected to the first current spreading structure 115 via a first connecting element 122. The first current spreading structure 115 is indicated by a dashed line since it is arranged within the dielectric mirror layer 140. The second bond pad 133 is connected to the second current spreading structure 135 via the second connecting element 132. The second current spreading structure 135 is indicated by a dashed line since it is buried within the dielectric mirror layer 140. For example, the first current spreading structure 115 may have a width d1. The second current spreading structure 135 may have a width d2. For example, a lateral dimension of the first or second current spreading structures may be more than 1 µm. It may be less than 100 µm. For example, the width of the current spreading structure may be in a range of 2-30 µm, for example 3-10 µm. The width of the current spreading structure 115, 135 will be dependent on the dimensions of the optoelectronic semiconductor component. FIG. 2A shows a cross-sectional view through an optoelectronic semiconductor component according to further embodiments. In addition to the components of the optoelectronic semiconductor component shown in FIG. 1A, the optoelectronic semiconductor component 10 shown in FIG. 2A has a dielectric mirror element 142 arranged between the transparent contact layer 121 and the first semiconductor layer 120 in a region of the first current spreading structure 115. The dielectric mirror element 142 may be constructed in a manner similar to the dielectric mirror layer 140. Electromagnetic radiation emitted by the semiconductor layers 120, 130 is reflected by the dielectric mirror element 142 before it reaches the first current spreading structure 115. Alternatively, the dielectric mirror element 142 may be replaced by a dielectric layer.

Figure 2B:
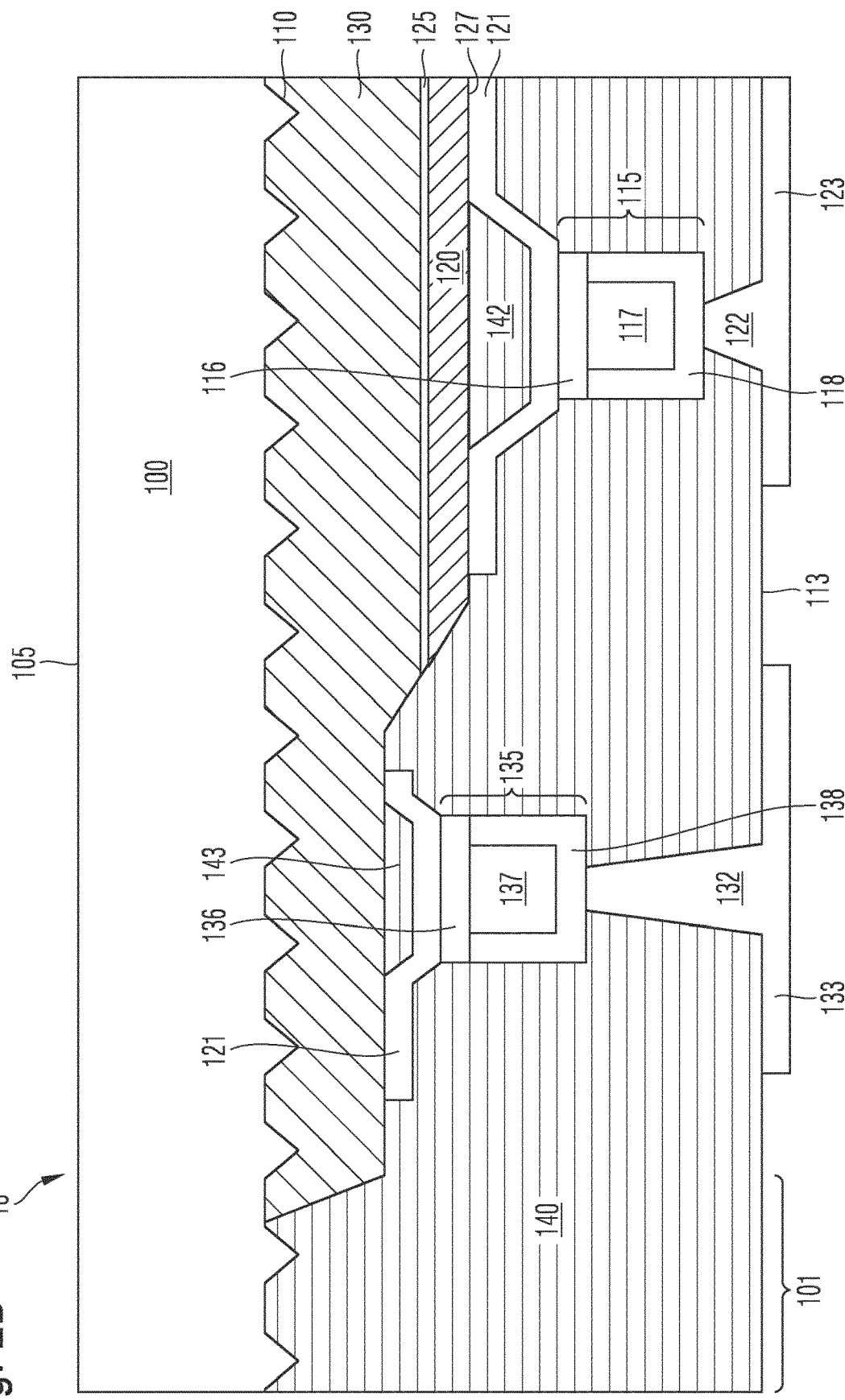

FIG. 2B shows a schematic cross-sectional view of an optoelectronic semiconductor component according to further embodiments. In contrast to the embodiments shown in FIG. 2A, the semiconductor component shown in FIG. 2B additionally includes a dielectric mirror element 143 between second contact layer 136 and second semiconductor layer 130 in the area of the second current spreading structure 135. The second dielectric mirror element 143 may have a structure similar to that of the dielectric mirror layer 140. Due to the presence of the dielectric mirror element 143, electromagnetic radiation is reflected back in the direction of the first main surface 105 of the substrate 100 before it reaches the second current spreading structure 135. Alternatively, the second dielectric mirror element may be replaced by a dielectric layer.

For the purpose of producing the optoelectronic semiconductor component described, a second semiconductor layer, an active region 125, if applicable, and a first semiconductor layer 120 are epitaxially grown over an insulating substrate 100 over a second main surface of an insulating substrate, for example a sapphire substrate. The second main surface 110 of the insulating substrate 100 may, for example, be roughened or patterned in order to increase the output efficiency of the emitted electromagnetic radiation. For example, the applied semiconductor layer stack may be patterned in order to etch a mesa. More precisely, a part of the first semiconductor layer 120 and a part of the second semiconductor layer 130 are etched back, so that the step-like structure of the semiconductor layers as shown, for example, in FIG. 1A results.

If necessary, a dielectric mirror element 142, 143 may be deposited in a next step. In the finished component, this dielectric mirror element 142, 143 will be arranged between the first semiconductor layer 120 and the first current spreading structure 115 and between the second semiconductor layer 130 and the second current spreading structure 135, respectively.

A transparent contact layer 121 may then be formed over the first semiconductor layer 120. The transparent contact layer 121 is deposited over the entire surface of the wafer and patterned by a subsequent etching process. In this etching process, a part of the second semiconductor layer 130 may be etched away, depending on the design of the optoelectronic component, for example if it is constructed as shown in FIG. 2A or 2B. Subsequently, the layers for forming the first and second current spreading structures 115, 135 are deposited. For example, a contact layer 116, 136 is first deposited, followed by a silver layer 117, 137. After structuring the silver layer 137, 117, a barrier layer 118, 138 is subsequently deposited such that it covers the exposed surface of the silver layer 117, 137 and its side walls. The layers for forming the dielectric mirror layer 140 are then applied over the entire surface. For example, the layers may be applied by known methods. According to embodiments, a polishing process may subsequently be carried out in order to provide a planar or planarized topology. According to further embodiments, the dielectric mirror layer 140 may be applied as a spin-on glass layer in order to provide a planarized topology.

Openings for contacting the first or second current spreading structure 115, 135 are defined using an etching process. Conductive material is then deposited which fills the openings produced in the dielectric mirror layer 140. Both the first and second connecting elements 122, 132 and the first and second bond pads 123, 133 are formed by this method.

Figure 2C:
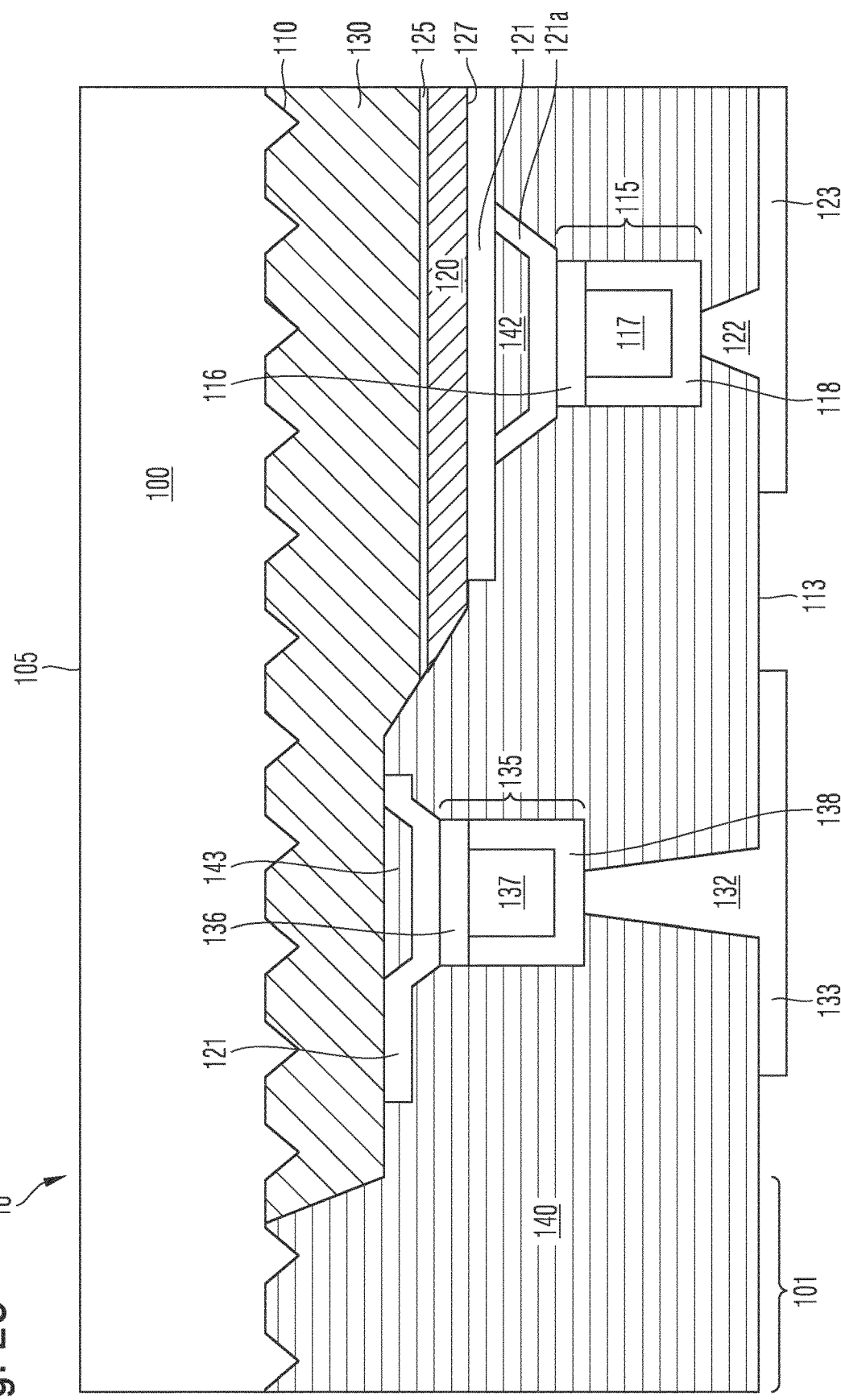

FIG. 2C shows a further modification of the semiconductor component shown in FIG. 2B. In addition to the elements shown in FIG. 2B, the transparent contact layer 121 is formed such that it is directly adjacent to the first semiconductor layer 120 in the region of the first semiconductor layer 120. Furthermore, a part 121a of the transparent contact layer is arranged at a distance from the first semiconductor layer 120. In addition, the dielectric mirror element 142 is arranged between the spaced-apart part 121a of the transparent contact layer and the transparent contact layer 121. In this manner, a lateral widening of the contact surface may be achieved, whereby a more homogeneous current injection is achieved. It is also possible to provide the electrical mirror element 142, as a result of which a larger proportion of the electromagnetic radiation generated is reflected in the direction of the substrate 100. For example, the transparent contact layer 121 may be formed as a layer over the first semiconductor layer 120 and the second semiconductor layer 130 and subsequently patterned.

Figure 2D:
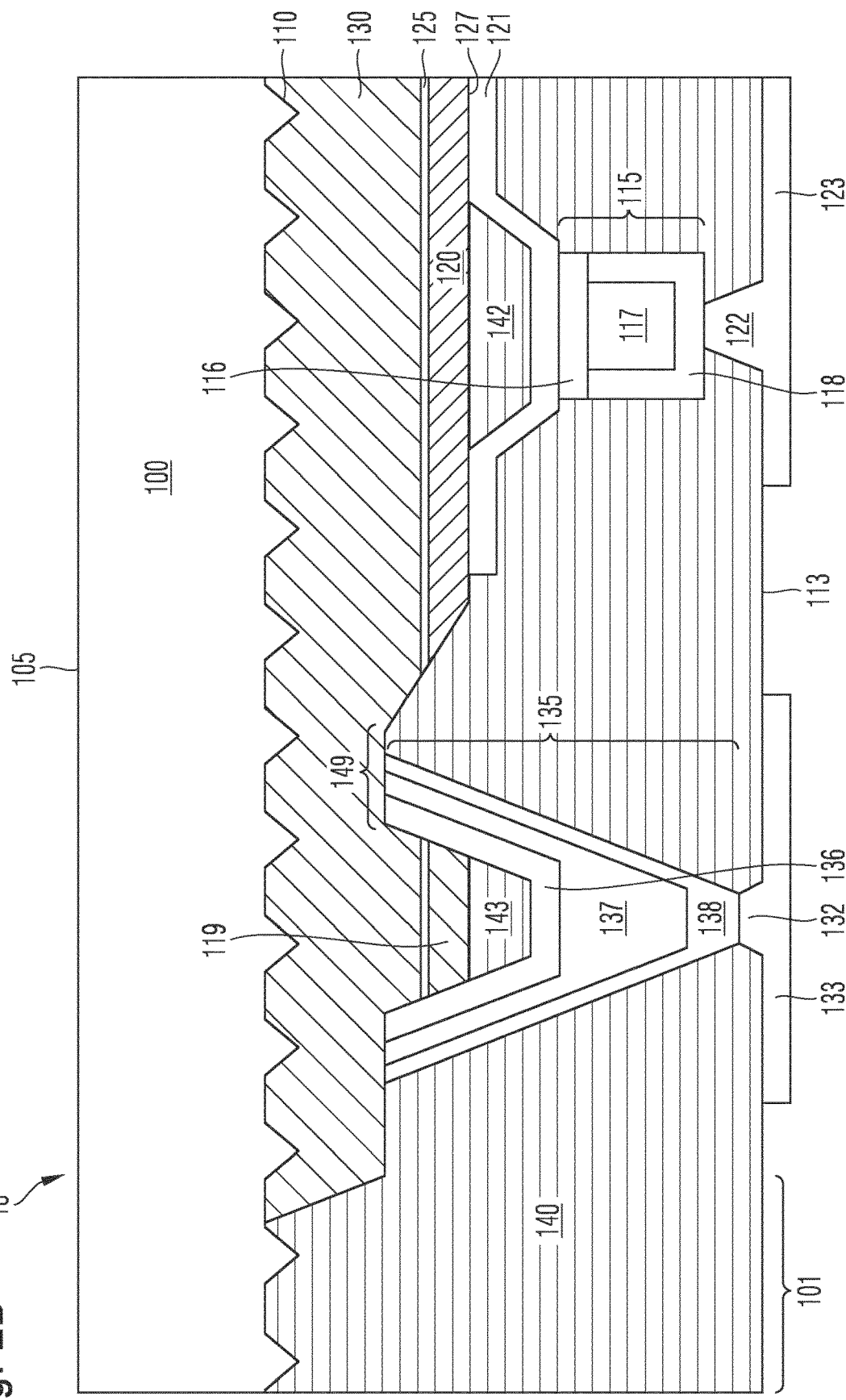

Most of the components of the semiconductor component shown in FIG. 2D essentially correspond to the components of the semiconductor component shown in FIG. 2B. In contrast thereto, however, the second current spreading structure 135 is formed in a different way. More precisely, the first semiconductor layer 120 is formed in such a manner that it is not completely etched away or removed in the region of the second current spreading structure 135, but forms an isolated island 119. The island 119 may be web-shaped in a direction perpendicular to the direction of the cross section. The contact layer 136, the current spreading layer 137 made of silver, and the barrier layer 138 are formed in such a manner that they each extend along the island 119 and the directly adjacent active region 125 up to the second semiconductor layer 130. Consequently, the second current spreading structure 135 contacts not only the second semiconductor layer 130, but also isolated parts of the first semiconductor layer 120. However, as these parts are separated from the rest of the first semiconductor layer 120 by separating trenches 149, no short circuit occurs between the first semiconductor layer 120 and the second semiconductor layer 130. A dielectric mirror element 143 is arranged between the island 119 and the directly adjacent contact layer 136. The dielectric mirror element 143 causes a reflection of the emitted electromagnetic radiation, thereby increasing the efficiency of the light generation. According to further embodiments, a part of the transparent contact layer 121 may additionally be arranged directly adjacent to the contact layer 136 and the second semiconductor layer 130, similar to the arrangement shown in FIG. 2B.

The embodiment of the second current spreading structure as shown in FIG. 2D allows for the second dielectric mirror element 143 to be provided between the contact layer 136 and the second semiconductor layer 130 by a simple modification of the method. More precisely, no additional process step is required for this purpose; rather the second dielectric mirror element 143 may be formed, for example, simultaneously with the first mirror element 142 and by a structuring process that follows. Subsequently the mesa, for example, may be etched. This enables a gain in performance to be achieved without additional process costs.

Figure 3A:
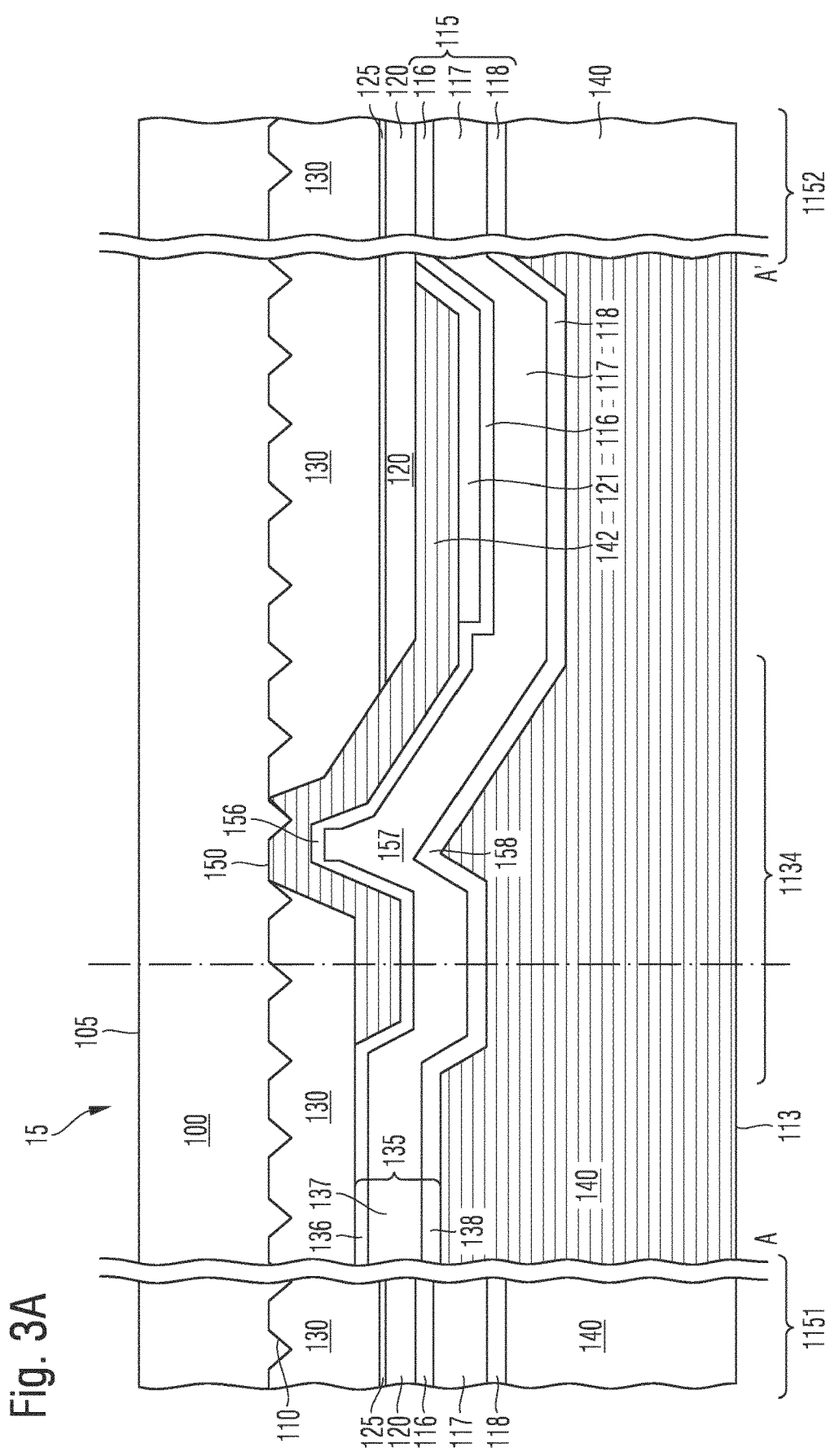
FIG. 3A shows a section of an optoelectronic device according to embodiments.

FIG. 3A shows a schematic cross-sectional view through part of an optoelectronic device 15 according to further embodiments. The optoelectronic device comprises a first light-emitting region 1151 and a second light-emitting region 1152, which are connected in series and are connected to one another via a connecting structure 1134. The connecting structure 1134 is suitable for connecting the second semiconductor layer 130 of the first light-emitting region 1151 to the first semiconductor layer 120 of the second light-emitting region 1152.

As shown in FIG. 3A, the optoelectronic device 15 comprises a transparent substrate 100, a first semiconductor layer 120 of a first conductivity type, for example p-type, and a second semiconductor layer 130 of a second conductivity type, for example n-type. The second semiconductor layer 130 is arranged between the transparent substrate 100 and the first semiconductor layer 120. The first and the second semiconductor layers 120, 130 are patterned to form at least a first and a second light-emitting region 1151, 1152. The optoelectronic device furthermore comprises a dielectric mirror layer 140 which is arranged on a side of the first semiconductor layer 120 facing away from the substrate 100 and on a side of the connecting structure 1134 facing away from the first semiconductor layer. The connecting structure 1134 contains silver. The dielectric mirror layer may be embodied as described with reference to FIG. 1A to 2D. For example, the dielectric mirror layer 140 may be formed with a layer thickness such that it extends from a side facing the first semiconductor layer 120 to a side of the connecting structure 1134 facing away from the first semiconductor layer. For example, a layer thickness of the dielectric mirror layer 140 may be greater than a layer thickness of the connecting structure 1134. According to embodiments, the layer thickness of the electrical mirror layer may be significantly greater than the layer thickness of the connecting structure 1134, for example, at least twice as great. The layer thickness is measured in each case in a growth direction, for example perpendicular to the first main surface of the first semiconductor layer 120.

For example, the first and second light-emitting regions 1151, 1152 may each be formed in a manner similar to that shown in FIGS. 1A, 2A, 2B, 2C and 2D. For example, an active region 125 may be arranged between the first semiconductor layer 120 and the second semiconductor layer 130. The first semiconductor layer 120 of the first light-emitting region 1151 and the second semiconductor layer 130 of the second light-emitting region 1152 may, for example, be electrically connected in a manner similar to that described with reference to FIGS. 1A to 2D. For example, they may be electrically connected in the manner described via current spreading structures 115, 135.

In accordance with configurations, the layer stack comprising first and second semiconductor layers 120, 130 may be patterned by a separating trench 150. The separating trench 150 may, for example, extend to a second main surface 110 of the substrate 100. The dielectric mirror layer 140 encapsulates the connecting structure 1134. For example, the dielectric mirror layer 140 is arranged such that it covers an edge of the mesa, thereby preventing a short circuit between the first and second semiconductor layers 120, 130. The connecting structure 1134 may comprise a contact layer 156 and a connecting layer 157 made of silver and directly adjacent to the contact layer 156. The connecting layer 157 may consist of silver or comprise silver. For example, the connecting layer 157 may comprise a layer stack in which at least one layer contains or consists of silver. The connecting structure 1134 may further comprise a barrier layer 158. In this case, a combination of the contact layer 156 and the barrier layer 158 may completely enclose the connecting layer 157 made of silver, in a manner similar to that discussed above with reference to FIG. 1A. Materials and layer thicknesses of the contact layer 156, the connecting layer 157, and the barrier layer 158 may be configured as discussed above with reference to FIG. 1A for the current spreading structures 115, 135. According to embodiments, respective layers for forming each of the barrier layers, current spreading layers, connecting layers and contact layers may be produced by common methods. For example, one deposition process may be used to deposit each of the contact layers, current spreading or connecting layers and barrier layers.

For example, a transparent conductive layer 121 may be arranged between the contact layer 116 and the first semiconductor layer 120. In addition, a dielectric mirror element 142 may be arranged between the connecting structure 1134 and the first or second semiconductor layer 120, 130. Furthermore, the dielectric mirror element 142 may also be arranged between the contact layer 116 and part of the first semiconductor layer 120. The dielectric mirror element 142 may be constructed in a manner similar to that of the dielectric mirror layer 140. Due to the presence of the dielectric mirror element, emitted electromagnetic radiation may be reflected back in the direction of the transparent substrate 100. For example, the connecting layer made of silver 157 may be connected to the second semiconductor layer 130 via the contact layer 156. Furthermore, the connecting layer 157 made of silver may be connected to the first semiconductor layer 120 via the contact layer 156 or the transparent contact layer 121.

Figure 3B:
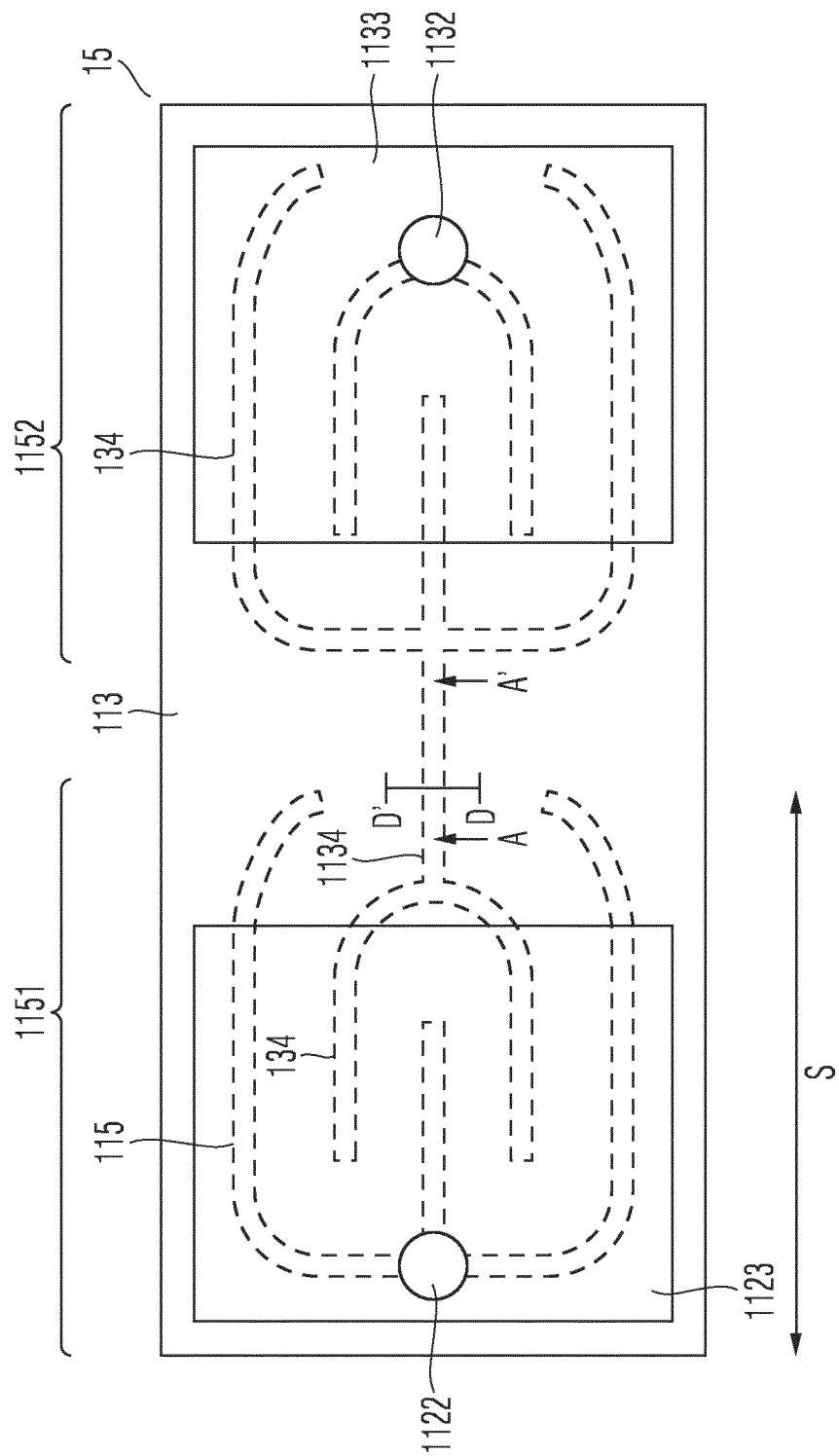
FIG. 3B shows a plan view of the rear side of the optoelectronic device according to embodiments.

FIG. 3B shows a schematic plan view of the second main surface 113 of the dielectric mirror layer 140.

A first bond pad 1123 and a second bond pad 1133 are each arranged on the second main surface 113 of the dielectric mirror layer 140. The first bond pad 1123 is connected to the first current spreading structure 1115 via a first connecting element 1122. The first current spreading structure 1115 is indicated by a dashed line, as it is buried within the electrical mirror layer 140. The first current spreading structure 1115 is electrically connected to the first semiconductor layer 120 of the first light emitting region 1151. Furthermore, the second bond pad 1133 is electrically connected to a second current spreading structure 1135 via a second connecting element 1132. The second current spreading structure 1135 is indicated by a dashed line, as it is buried within the dielectric mirror layer 140. The second current spreading structure 1135 is electrically connected to the second semiconductor layer 130 of the second light-emitting region 1152. In general, the first current spreading structure 1115 and the second current spreading structure 1135 may be embodied in a manner similar to that described with reference to FIGS. 1A, 2A, 2B, 2C and 2D. For example, at least one of the first and second current spreading structures 1115, 1135 contain silver. For example, the first and/or second current spreading structure may comprise a first or second contact layer and a first or second current spreading layer made of silver and directly adjacent to the first or second contact layer. A connecting structure 1134 is arranged between the first and second light-emitting regions 1151, 1152. The connecting structure 1134 is also indicated by a dashed line, as it is buried within the dielectric mirror layer 140. The connecting structure 1134 is embodied as described with reference to FIG. 3A. For example, the length s of a light-emitting region 1151, 1152 may be about 800 μm, the width may be about 600 μm; if two light-emitting regions are arranged one behind the other, the length of the optoelectronic device doubles. For example, a length of the region in which the connecting structure 1134 is arranged may be about 5 to 15 μm.

Figure 3C:
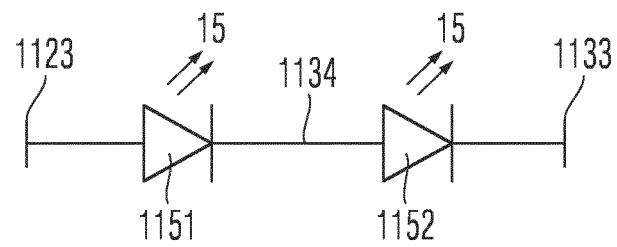
FIG. 3C shows a schematic circuit diagram of the optoelectronic device.

FIG. 3C shows a circuit diagram of the optoelectronic device 15 shown in FIGS. 3A and 3B, respectively. As may be seen, the two light-emitting regions 1151, 1152 are connected in series, the first semiconductor layer of the second light-emitting region being connected to the second semiconductor layer of the first light-emitting region 1151 via the connecting structure 1134. Such a series connection enables a higher luminance to be achieved when a correspondingly higher voltage is applied. Of course, further light-emitting regions may be combined and connected in series. For example, a scalable voltage of a value equivalent to a multiple of a single light-emitting region may be realized thereby. For example, three light-emitting regions may be connected in series with a total voltage of 3×3V=9V.

According to further configurations, further light-emitting regions may also be connected in parallel. For example, an optoelectronic device may comprise a parallel connection of light-emitting regions connected in series. For example, 2 assemblies of three light-emitting regions connected in series may be connected in parallel to one another, so that an arrangement of 6 light-emitting regions results.

Figure 3D:
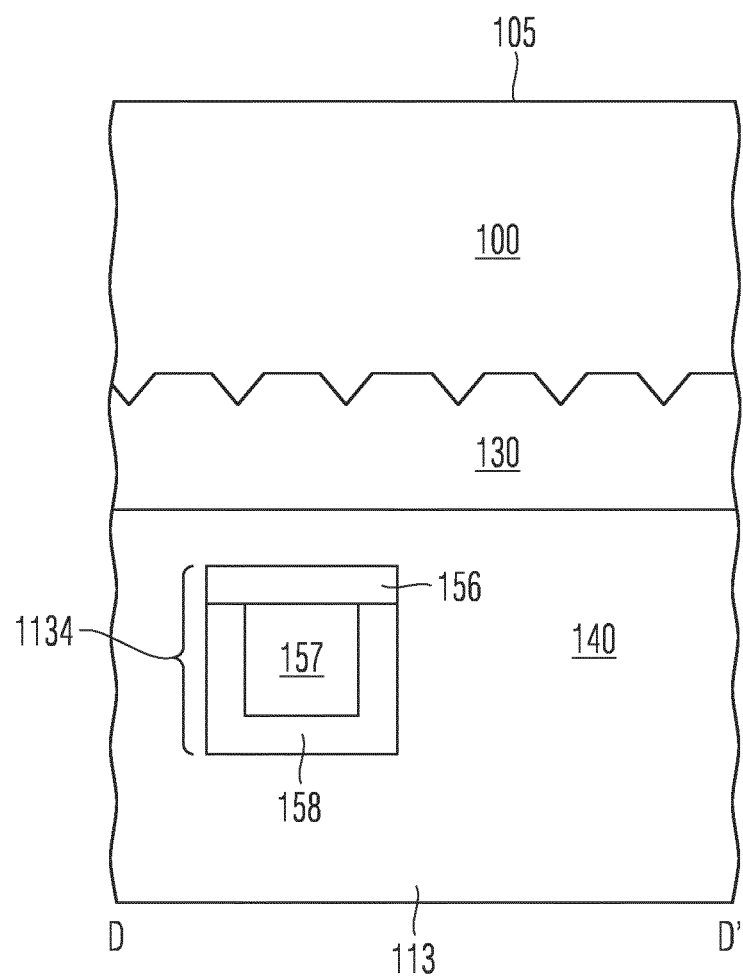
FIG. 3D shows a cross-sectional view of a detail of the optoelectronic device.

FIG. 3D shows a cross-sectional view through part of the connecting structure 1134 in a plane perpendicular to the cross-sectional plane of FIGS. 3A and 3B. The position of the cross section is indicated in FIGS. 3A and 3B. As may be seen, the connecting layer 157 is completely enclosed by the combination of contact layer 156 and barrier layer 158. Furthermore, the connecting structure 1134 is completely enclosed by the dielectric mirror layer 140. In this way, the connecting structure 157 is completely encapsulated, and problems that might arise when using a connecting structure 1134 made of silver are avoided.

Figure 4:
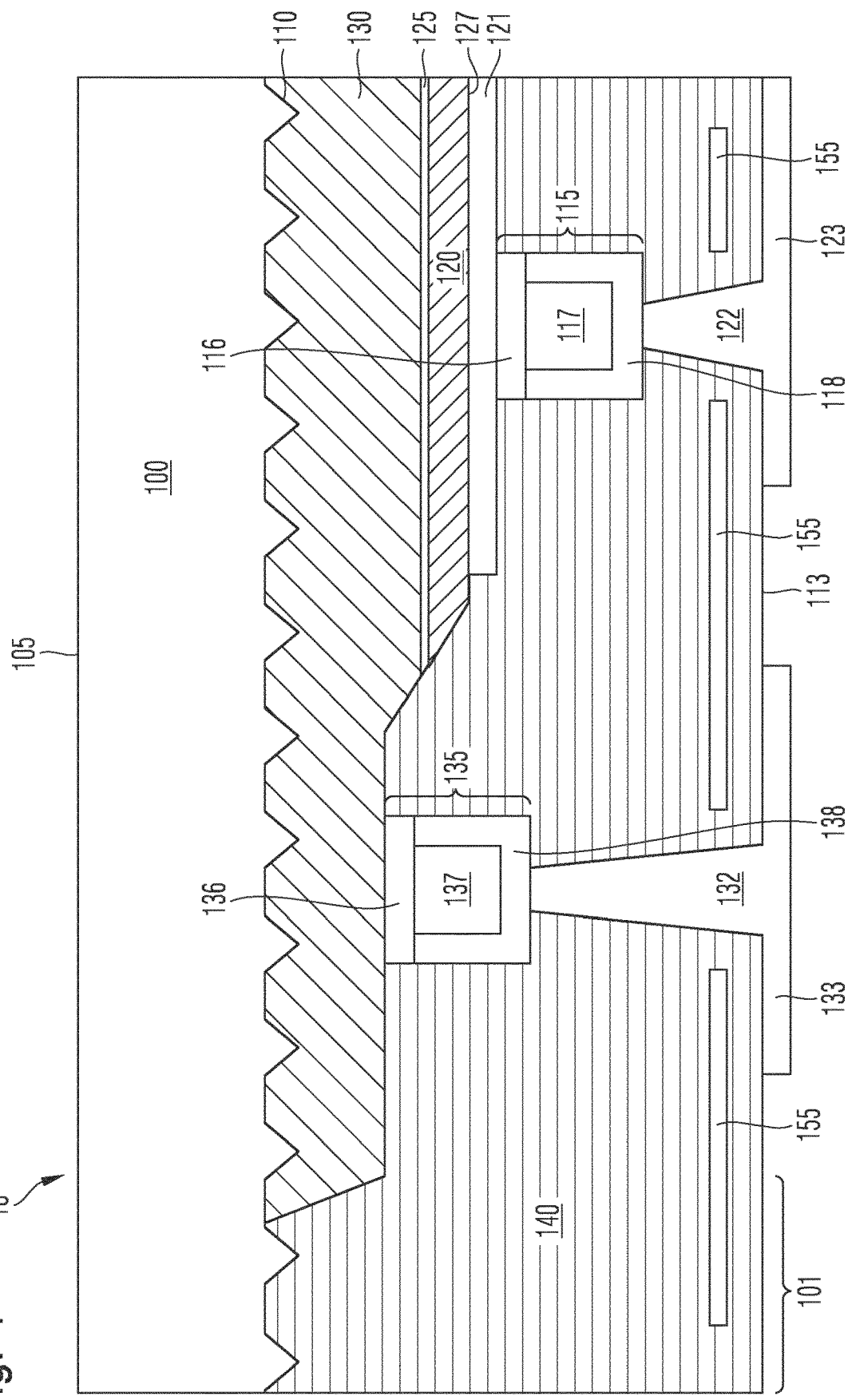
FIG. 4 shows a schematic cross-sectional view of an optoelectronic semiconductor component according to further embodiments.

FIG. 4 shows a schematic cross-sectional view of an optoelectronic semiconductor component 10 according to further embodiments. In addition to the components shown in FIG. 1A, the optoelectronic component additionally comprises metal structures 155 which are buried in the dielectric mirror layer 140 and are arranged in an area positioned in the vicinity of the second main surface of the dielectric mirror layer 140. The combination of the dielectric mirror layer 140 and the metal structure 155 is referred to as an "omnidirectional mirror", as all angles of incident light are reflected. For example, depending on the wavelength of the emitted light, the dielectric mirror layer 140 is unable to reflect certain angles of incident light (Bragg angle). This portion of light is reflected by the metal structures 155. A material of the metal structure may include, for example, silver, aluminum, rhodium, titanium, platinum, palladium, chromium, nickel, molybdenum, tungsten, gold or any combination of these materials. For example, the metal structure 155 may be constructed as a layer stack from different layers of the materials mentioned. In addition, for example, the layer stack may include adhesive layers such as ITO. According to embodiments, the metal structure 155 may consist of or contain aluminum and may include a layer thickness of more than 50 nm, for example less than 200 nm, for example in a range from 70-130 nm. The metal structure 155 should be electrically insulated from the first and second connecting elements 122, 132 and from the first and second bond pads 123, 133. As shown in FIG. 4, part of the electrical mirror layer may, for example, be arranged between the metal structure 155 and an directly adjacent bond pad. According to further embodiments, however, any dielectric layer may be arranged between the metal structure 155 and the first or second bond pad 123, 133.

Figure 5:
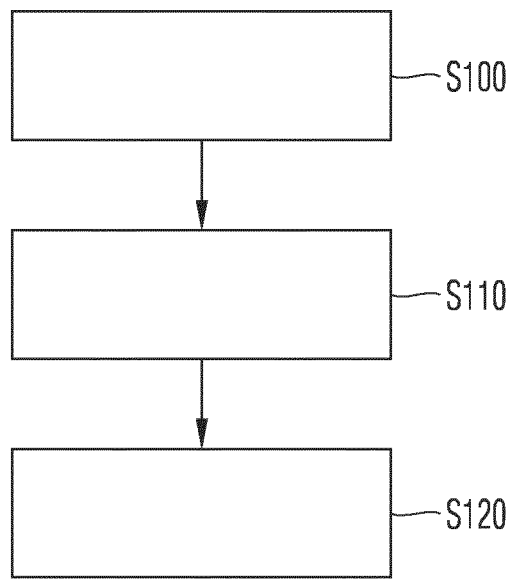
FIG. 5 outlines a method for producing an optoelectro semiconductor component.

FIG. 5 outlines the method described. A method for producing an optoelectronic semiconductor component comprises forming (S100) a layer stack comprising a first semiconductor layer of a first conductivity type and a second semiconductor layer of a second conductivity type over a transparent substrate, wherein the second semiconductor layer is arranged between the first semiconductor layer and the substrate and a first main surface of the first semiconductor layer is present on a side of the first semiconductor layer facing away from the second semiconductor layer. The method further comprises forming (S110) a first current spreading structure which is connected to the first semiconductor layer, and a second current spreading structure which is connected to the second semiconductor layer, each on the side of the first main surface, wherein at least one of the first and second current spreading structures contains silver. Furthermore, the method comprises forming (S120) a dielectric mirror layer on the side of the first main surface of the first semiconductor layer and on a side of the first or second current spreading structure facing away from the first semiconductor layer.

For example, the dielectric mirror layer may be formed with a layer thickness such that it extends from a side facing the first semiconductor layer 120 to a side of the first or second current spreading structure which contains silver facing away from the first semiconductor layer.

Therefore, as described, the optoelectronic semiconductor component 10 may be produced in a simple manner. Further steps described in this description or suitable for producing elements included in this description may be added.

Figure 6:
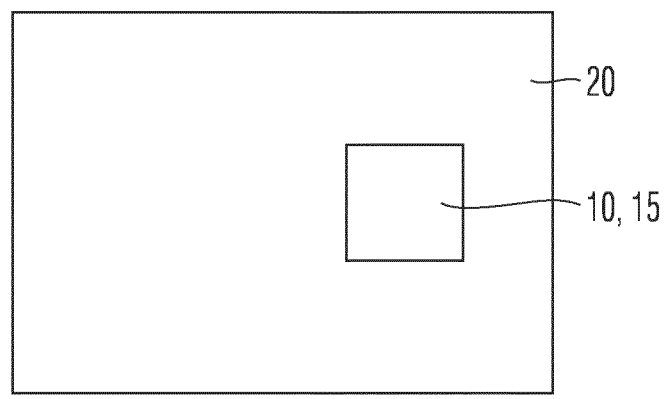
FIG. 6 illustrates an optoelectronic element according to embodiments.

FIG. 6 shows an optoelectronic element 20 according to embodiments. The optoelectronic element 20 comprises the optoelectronic semiconductor component 10 or the optoelectronic device 15 according to embodiments. As described, the optoelectronic semiconductor component 10 or the optoelectronic device 15 each represents a flip-chip component. A flip-chip component may be electrically contacted in a simple manner without wire bonding. Possible fields of application of optoelectronic semiconductor components 10 or optoelectronic devices 15 are therefore in the field of flexible filaments or LED filaments.

Although specific embodiments have been illustrated and described herein, those skilled in the art will recognize that the specific embodiments shown and described may be replaced by a variety of alternative and/or equivalent configurations without departing from the scope of the claims. The application is intended to cover any adaptations or variations of the specific embodiments discussed herein. Therefore, the invention is to be limited only by the claims and their equivalents.

LIST OF REFERENCES 10 optoelectronic semiconductor component
15 optoelectronic device
20 optoelectronic element
100 substrate
101 edge region
105 first main surface of the substrate
110 second main surface of the substrate
113 first main surface of the dielectric mirror layer
115, 1115 first current spreading structure
116 first contact layer
117 first current spreading layer
118 first barrier layer
119 web
120 first semiconductor layer
121 transparent contact layer
121a part of the transparent contact layer
122, 1122 first connecting element
123, 1123 first bond pad
125 active region
127 first main surface of the first semiconductor layer
130 second semiconductor layer
132, 1132 second connecting element
133, 1133 second bond pad
1134 connecting structure
135, 1135 second current spreading structure
136 second contact layer
137 second current spreading layer
138 second barrier layer
140 dielectric mirror layer
142 dielectric mirror element
143 dielectric mirror element
149 separating trench
150 separating trench
1151 first light emitting region
1152 second light emitting region
155 metal structure
156 contact layer
157 connecting layer
158 barrier layer

The invention claimed is:

1. An optoelectronic semiconductor component, comprising:
a first semiconductor layer of a first conductivity type having a first main surface;
a second semiconductor layer of a second conductivity type arranged on a side facing away from the first main surface of the first semiconductor layer;
a first current spreading structure electrically connected to the first semiconductor layer, on the side of the first main surface;
a second current spreading structure electrically connected to the second semiconductor layer, on the side of the first main surface; and
a dielectric mirror layer on the side of the first main surface of the first semiconductor layer,
wherein at least one or both of the first and second current spreading structures contains silver,
the dielectric mirror layer being formed to have a layer thickness such that it extends from a side facing the first semiconductor layer to a side of the one or both of the first current spreading structure or the second current spreading structure which contains silver facing away from the first semiconductor layer,
wherein the dielectric mirror layer is directly adjacent to side walls of the first current spreading structure and/or the second current spreading structure.

2. The optoelectronic semiconductor component according to claim 1, wherein the first current spreading structure comprises a first contact layer and a first current spreading layer; wherein the first current spreading layer comprises of silver and is directly adjacent to the first contact layer.

3. The optoelectronic semiconductor component according to claim 2, wherein the first current spreading structure further includes a first barrier layer, a combination of the first contact layer and the first barrier layer completely enclosing the first current spreading layer that comprises silver.

4. The optoelectronic semiconductor component according to claim 2, further comprising a transparent conductive layer between the first contact layer of the first current spreading structure and the first semiconductor layer.

5. The optoelectronic semiconductor component according to claim 4, further comprising a dielectric mirror element between the transparent conductive layer and the first semiconductor layer.

6. The optoelectronic semiconductor component according to claim 1, wherein the second current spreading structure comprises a second contact layer and a second current spreading layer; wherein the second current spreading layer comprises silver and is directly adjacent to the second contact layer.

7. The optoelectronic semiconductor component according to claim 6, wherein the second current spreading structure further includes a second barrier layer, a combination of the second contact layer and the second barrier layer enclosing the second current spreading layer; wherein the second current spreading structure comprises silver.

8. The optoelectronic semiconductor component according to claim 1, further comprising a first bond pad and a second bond pad, the first bond pad being connected to the first current spreading structure via a first connecting element and the second bond pad being connected to the second current spreading structure via a second connecting element, the first and second bond pads being arranged on a side of the dielectric mirror layer facing away from the first and second semiconductor layers, respectively, and each of the first connecting element and the second connecting element extending through the dielectric mirror layer.

9. The optoelectronic semiconductor component according to claim 1, further comprising a dielectric mirror element between the second semiconductor layer and the second current spreading structure.

10. The optoelectronic semiconductor component according to claim 1, wherein the first semiconductor layer and the second semiconductor layer are arranged over a transparent substrate having a first main surface on a side facing away from the first main surface of the substrate, and wherein generated electromagnetic radiation is configured to be emitted via the first main surface of the substrate.

11. The optoelectronic semiconductor component according to claim 1, wherein the second current spreading structure is directly adjacent to a part of the first semiconductor layer, wherein the part of the first semiconductor layer is insulated from the first current spreading structure.

12. The optoelectronic semiconductor component according to claim 1, further comprising a metal structure arranged in the dielectric mirror layer or is directly adjacent to a side of the dielectric mirror layer facing away from the first semiconductor layer.

13. A method for producing an optoelectronic semiconductor component, comprising:
forming a layer stack comprising a first semiconductor layer of a first conductivity type and a second semiconductor layer of a second conductivity type over a transparent substrate, wherein the second semiconductor layer is arranged between the first semiconductor layer and the substrate, and wherein a first main surface of the first semiconductor layer is located on a side of the first semiconductor layer facing away from the second semiconductor layer;
forming a first current spreading structure connected to the first semiconductor layer, and a second current spreading structure connected to the second semiconductor layer, each on the side of the first main surface, wherein at least one or both of the first current spreading structure and the second current spreading structures contains silver;
forming a dielectric mirror layer on the side of the first main surface of the first semiconductor layer, the dielectric mirror layer being formed to have a layer thickness such that it extends from a side facing the first semiconductor layer to a side of the one or both of the first current spreading structure or the second current spreading structure that contains silver facing away from the first semiconductor layer, wherein the dielectric mirror layer is directly adjacent to side walls of the first current spreading structure and/or the second current spreading structure.

14. An optoelectronic device comprising:
a transparent substrate;
a first semiconductor layer of a first conductivity type;
a second semiconductor layer of a second conductivity type arranged between the transparent substrate and the first semiconductor layer,
wherein the first semiconductor layer and the second semiconductor layer are patterned to form at least a first light-emitting region and a second light-emitting region, and wherein the optoelectronic device further comprises:
a connecting structure configured to connect the second semiconductor layer of the first light-emitting region to the first semiconductor layer of the second light-emitting region and which contains silver, and
a dielectric mirror layer formed on a side of the second semiconductor layer facing away from the substrate and on a side of the first semiconductor layer facing away from the substrate to have a layer thickness such that it extends from a side of the connecting structure facing the first semiconductor layer to a side of the connecting structure facing away from the first semiconductor layer.

15. The optoelectronic device according to claim 14, wherein the dielectric mirror layer is directly adjacent to side walls of the connecting structure.

16. The optoelectronic device according to claim 14, wherein the connecting structure comprises a contact layer and a first connection layer; wherein the first connection layer comprises silver and directly adjacent to the contact layer.

17. The optoelectronic device according to claim 16, wherein the connecting structure further comprises a barrier layer, wherein a combination of the contact layer and the barrier layer completely encloses the contact layer that comprises silver.

* * * * *